US006797962B1

(12) United States Patent
Rose et al.

(10) Patent No.: US 6,797,962 B1
(45) Date of Patent: Sep. 28, 2004

(54) ELECTROSTATIC CORRECTOR FOR ELIMINATING THE CHROMATIC ABERRATION OF PARTICLE LENSES

(75) Inventors: Harald Rose, Darmstadt (DE); Stephan Uhlemann, Heidelberg (DE); Christoph Weissbacker, Dieburg (DE)

(73) Assignee: CEOS Corrected Electron Optical Systems GmbH, Heidelberg (DE)

(*) Notice: Subject to any disclaimer, the term of this patent is extended or adjusted under 35 U.S.C. 154(b) by 82 days.

(21) Appl. No.: 10/018,193

(22) PCT Filed: Jun. 14, 2000

(86) PCT No.: PCT/DE00/01882

§ 371 (c)(1),
(2), (4) Date: Mar. 5, 2002

(87) PCT Pub. No.: WO00/77819

PCT Pub. Date: Dec. 21, 2000

(30) Foreign Application Priority Data

Jun. 14, 1999 (DE) .......................................... 199 26 927

(51) Int. Cl.[7] .............................. H01J 3/14; H01J 3/18
(52) U.S. Cl. ................... 250/396 R; 250/305; 250/311; 250/397; 250/398
(58) Field of Search ................................ 250/305, 311, 250/396 R, 397, 398, 399, 400, 492.2, 492.22; 356/123; 324/751; 315/370

(56) References Cited

U.S. PATENT DOCUMENTS

| 3,795,813 | A | * | 3/1974 | Kunath | 250/396 R |
| 4,142,132 | A | * | 2/1979 | Harte | 315/370 |
| 4,209,698 | A | * | 6/1980 | Hoppe | 250/311 |
| 4,823,003 | A | * | 4/1989 | King et al. | 250/305 |
| 4,963,823 | A | * | 10/1990 | Otto et al. | 324/751 |
| 5,545,902 | A | * | 8/1996 | Pfeiffer et al. | 250/492.2 |
| 6,104,029 | A | * | 8/2000 | Coxon et al. | 250/305 |
| 6,184,975 | B1 | * | 2/2001 | Henstra et al. | 356/123 |
| 6,222,197 | B1 | * | 4/2001 | Kojima | 250/492.22 |

* cited by examiner

Primary Examiner—Nikita Wells
Assistant Examiner—Mary El-Shammaa
(74) Attorney, Agent, or Firm—Edwin D. Schindler

(57) ABSTRACT

An electrostatic corrector for eliminating the chromatic aberration of particle lenses, includes a corrector having a straight optical axis and an electrostatic quadrupole for allocating to the objective lens. Two corrector pieces are positioned behind the quadrupole, along the optical axis in the direction of radiation. Each corrector piece has three electrical quadrupole fields with an overlying circular lens field. The quadrupole fields, however, are rotated 90° about the optical axis in relation to each other. This arrangement is adjusted so that the astigmatic first image of one sectional view lies in one corrector piece and the astigmatic first image perpendicular thereto, of the other sectional view, lies in the other corrector piece, with another electrostatic quadrupole being located on the output side.

7 Claims, 1 Drawing Sheet

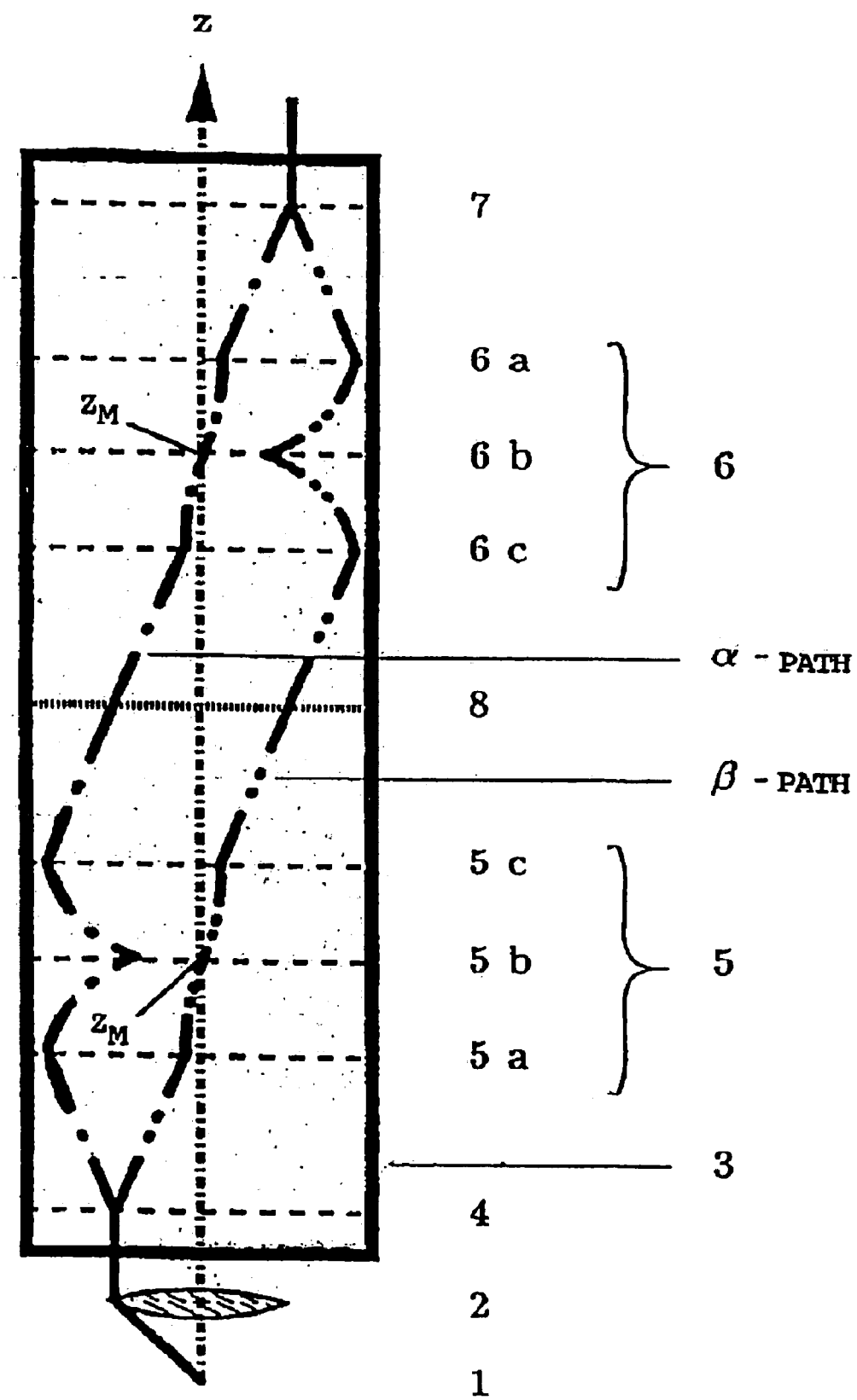

ELECTROSTATIC CORRECTOR FOR ELIMINATING THE CHROMATIC ABERRATION OF PARTICLE LENSES

This application is a 371 of PCT/DE00/01882 filed Jun. 14, 2000

BACKGROUND OF THE INVENTION

1. Technical Field of the Invention

The invention relates to an electrostatic corrector for eliminating the chromatic aberration of particle lenses, with a straight optical axis and an electrostatic quadrupole for allocating to an objective lens.

2. Description of the Prior Art

According to the Scherzer theorem (O. Scherzer, Zeitschrift für Physik 101, (1936) 593), it is known that in optical reproduction systems for charged particles, which is understood to mean principally electrons and ions, with the use of static, space-charge-free and rotationally symmetrical fields, the chromatic aberration (colour deviations) and spherical aberration (focussing deviations) do not necessarily disappear. Since these errors limit the capability of the reproductive optical systems and in particular the resolution capability, there has been no lack of attempts to eliminate these image errors. Most success is promised by the departure from rotationally symmetrical lenses, that is to say the use of non-circular lenses in the form of multipoles, in particular quadrupoles, octopoles and the like. By means of a corrector of this kind made up from electrical and magnetic multipoles, the two managing directors of the applicant have succeeded in completely correcting the spherical and chromatic aberration in a low-voltage scanning electron microscope (J. Zach, M. Haider Nucl. Instr. method A363 (1995) 316), wherein it was possible to demonstrate a resolution capability of 2 nm at an electron energy of 1 kV.

The disadvantages of the electromagnetic multipole correctors can be seen in the fact that, because of the remanence, the magnetic fields do not allow fast, precise and reproducible adjustment of the magnetic fields. A demagnetisation also requires removal of the coil cores, which represents considerable effort. Over a relatively long period, a relatively large drift of the magnetic fields occurs. Finally, the strong magnetic fields necessary in ion-optical devices, such as, for example, lithography, because of the large ion masses, can only be implemented with difficulty because of the dependency of focusing on the mass. Correctors for eliminating the chromatic aberration with purely electrical fields in both sections are not known.

On this basis, the object of the invention is to provide a corrector for eliminating the chromatic aberration of particle lenses, which is constructed entirely from electrical fields, that is to say without the use of magnetic fields.

SUMMARY OF THE INVENTION

This object is attained according to the invention in that two corrector pieces are arranged along the optical axis upstream of the quadrupole in the beam direction, each corrector piece has two electrical quadrupole fields with overlaid circular lens field, whose quadrupole fields, however, are rotated relative to one another through an angle of 90° about the optical axis, and the adjustment is carried out such that the astigmatic intermediate image of one section lies in one corrector piece and the astigmatic intermediate image, which is perpendicular thereto, of the other section lies in the other corrector piece, and finally a further electrostatic quadrupole is arranged at the output side.

The term chromatic aberration in the sense of the invention, in exact terminology, means the first order, first degree axial chromatic aberration. Herein, the word "axial" describes the fact that this chromatic aberration is only determined by the fundamental paths emerging from the optical axis in the object point, that is to say the fundamental solutions to the Gaussian optics. The chromatic aberration is thus independent of the extra-axial paths. The order describes the power to which the initial gradient of the fundamental path enters into the chromatic aberration; the first order case there is a linear dependency. The term "first degree" describes the fact that the chromatic aberration has a linear dependency on the relative velocity deviation of the mean velocity of the particles. In the case of monochromatic particles—i.e. particles of equal velocity and therefore also constant wavelength—the relative deviations thus become zero. In this case there is no chromatic aberration. In the language of optics, the chromatic aberration is often also termed "colour deviation".

The proposed electrostatic corrector, in its preferred construction, comprises four elements arranged one behind the other in the direction of the straight optical axis, namely—in the direction of the optical axis starting from the objective—first of a quadrupole and two corrector pieces arranged one behind the other, and finally—at the output end—of a further quadrupole. The quadrupole fields of the two corrector pieces are rotated with respect to one another about an angle of 90° about the optical axis.

The beam path in the corrector travels as follows; the axial beam path starting from the center of the objects first deflected by the objective lens and, after entry into the corrector, is first deflected by the electrical quadrupole in different manners in the two sections (X and Y section). The particle bundle is thereby focused in one section (e.g., in the X section) and caused to diverge in the other section (Y section), so that an astigmatic intermediate image is produced, which passes through the optical axis and is expediently positioned in the center of the first corrector piece. This corrector piece therefore does not significantly affect the path trajectory in the section in which the intermediate image lies (X section), because the axial path passes close to the optical axis and intersects it, wherein positive chromatic aberrations do occur, but because of the low distance from the axis they are only very small. In the section perpendicular thereto (Y section), on the other hand, the path trajectory, due to the quadrupole fields of the corrector piece, experiences a considerable influence and negative contribution to the chromatic aberration. There is thus an influencing of the chromatic aberration of one section in the first corrector piece and, in an analogous manner, of that of the second section in the second corrector piece. In dependence on the set potentials, an influencing of the chromatic aberration and in the ideal case a compensation of the chromatic aberration of the objective lens follow, so that the entire optical system formed of the objective lens and corrector has reproduction properties free of chromatic aberrations. The last quadrupole serves to re-combine the ray path to rotational symmetry again.

The generation of the astigmatic intermediate image within the corrector piece, i.e. the zero crossing of the corresponding paraxial path can be achieved by appropriate choice of the strength of the electrical quadrupole present at the input of the corrector. Variation of the potential of the electrical quadrupole fields of the corrector piece (circular lens component as well as quadrupole field intensity) with respect to one another, that is to say the opposing field between the quadrupole fields, results in the influencing and setting of the chromatic aberration.

The decisive advantages of the electrostatic corrector consist in a rapid and precise adjustment and setting of the fields, a problem-free handling with reproducible conditions even over a relatively long time period and also in the possible use in ion-optical equipment.

Particularly preferred embodiments are those in which a symmetrical construction and/or symmetrical course within a corrector piece with respect to its center plane and/or a symmetrical construction and/or symmetrical course of the fields of the two corrector pieces, with respect to the center plane between them is provided. Because of the symmetrical/anti-symmetrical course of the paraxial paths within the corrector pieces, numerous error integrals are cancelled out, or are at least made clear in an analytical manner and can be resolved without problem, which substantially contributes to the transparency and understanding of the behaviour of the corrector in different situations and settings. The symmetry with respect to the center plane of a corrector piece both in construction and in the setting of the electrical fields has the consequence an that the zero crossing of the corresponding paraxial path comes to lie exactly in the center plane. In addition, the two outer quadrupole fields of the same corrector piece are then identical.

Because of the construction and symmetry of the fields of the two corrector pieces, with maintenance of the relative rotation between them of 90°, an identical path trajectory is obtained in both sections, i.e. the correction of one section made in the first corrector piece takes place in the other section in the second corrector piece.

The resulting advantages are simple analytical resolvability and, because of the clarity, a resulting understanding of the behaviour of the corrector. Not only the adjustment is simplified, but also the handling in general; the possibility of setting fewer potentials also contributes to. simplification.

On the setting of the corrector: In principle it is possible, by influencing the chromatic aberration, to achieve any optional setting of the chromatic aberration of the overall system consisting of an objective lens and corrector. Often the declared aim is to make the overall aberration of the entire system zero, that is to say by means of the corrector to generate a negative chromatic aberration component, which compensates the further positive chromatic aberration generated from the objective lens and the individual corrector elements. In the above-described symmetrical conditions, only two parameters are available for setting the corrector piece, namely the ratio of the outer and center circular lens field and the intensity of the quadrupole field.

The elimination of the chromatic aberration takes place in an iterative process, which in the case of the above-described symmetrical construction also becomes particularly clear, and is described below: with a constant ratio of the two circular lens potentials of the corrector piece, the quadrupole intensity is varied, and thereby the chromatic aberration coefficient is measured. As soon as the chromatic aberration reaches its minimum value, the ratio of the circular lens field is also varied with the aim of further minimising the chromatic aberration. By multiple interative steps in the above-described manner, the chromatic aberration can then be completely eliminated. Mathematical considerations show that a complete correction of the chromatic aberration will only be possible for particular regions of the circular lens potentials of the corrector piece and of the quadrupole field intensities.

As mentioned at the outset, the capability of electron-optical imaging systems is limited by chromatic aberration and spherical aberration. The object of the above-described corrector consists in eliminating the first order, first degree axial chromatic aberration. In numerous applications, it is sought to additionally eliminate the spherical aberration, more specifically the third-order axial spherical aberration. To this end, octopole fields, that is to say fourfold fields, overlay the quadrupole fields. In the symmetrical construction described as a special embodiment, the octopole field overlays the center quadrupole field of the corrector piece. Through the choice and setting of the intensity of the quadrupole field, a setting and, if appropriate, compensation of the third-order axial spherical aberration is completely decoupled from the setting of the quadrupole fields serving to eliminate the chromatic aberration.

For the constructional implementation, it is possible in a single multipole element to generate quadrupole as well as octopole fields.

In a preferred further development, it is proposed to arrange a further, third corrector piece in the direction of the optical axis upstream of the existing corrector consisting of two corrector pieces. Both as regards the spatial arrangement as well as the intensity of the quadrupole and circular lens fields, a mirror-symmetrical arrangement with respect to the center plane of the second corrector piece and thereby with respect to the plane extending through the center of the corrector consisting of three corrector pieces. As a result, a third corrector piece is obtained, which is of mirror-symmetrical construction to the first corrector piece. For the two axial elementary paths, that is to say elementary paths proceeding from the optical axis in the object point, the path proceeding in the alpha section has point symmetry with respect to center of the corrector and the β-path proceeding perpendicular thereto has mirror symmetry with respect to the center of the corrector. The extra-axial paths proceeding outside the optical axis are, as regards the gamma section, mirror-symmetrical with respect to the center of the corrector, and the delta path extending in the plane perpendicular thereto proceeds point-symmetrically with respect to the center of the corrector. In the first and third corrector piece, specifically in the astigmatic intermediate image of the β path, a correction of the chromatic aberration in the xz section takes place. In the middle (second) corrector piece, the correction in the yz section follows in the astigmatic intermediate image of the alpha path. In general, the chromatic aberrations are different in the two sections. The optimum setting of the corrector is then obtained when the excitation of the corrector pieces and the geometry, in particular the distance between the front quadrupole and first corrector piece and between the corrector pieces, is chosen such that optimum setting of the corrector is provided. By means of this change of the geometry, the incidence into the second corrector piece can be optimized. Although the path incidence into the first and third corrector pieces is then less favourable as regards the chromatic aberration correction in the xz section, this disadvantage can be eliminated by the fact that the correction in this section is distributed between two corrector pieces, and thereby a compensation becomes possible. Because of the symmetry of the paths and the fields with respect to the center of the corrector, and thereby with respect to the center of second corrector piece, all extra-axial with a linear axial distance can be eliminated. The possibility is obtained of transmitting an extended image field, with the consequence that this corrector is also suitable for use beyond the scanning electron microscope. A contribution to this is also the elimination of the image aberration of the coma. A further advantage of this arrangement is the reduction of the combination aberration and here in particular minimisation of the third and fifth order axial image aberrations.

BRIEF DESCRIPTION OF THE DRAWING FIGURE

The single drawing FIGURE schematically illustrates the preferred construction and function of the electrostatic corrector of the present invention.

DETAILED DESCRIPTION OF THE DRAWING FIGURE AND PREFERRED EMBODIMENTS

Further details, features and advantages of the invention can be taken from the following descriptive part, wherein the construction and function of the electrostatic corrector proposed according to the invention can be obtained with reference to the drawing. The paraxial paths,α,β proceed from the object (1) and are deflected by the objective lens (2), which is subject to chromatic aberration. The corrector (3) comprises a quadrupole directed towards the objective lens (2), a first corrector piece (5), adjoining in the direction of the ray paths (5) and a further corrector piece (6) arranged at a distance therefrom. As can be seen from the drawing, the quadrupole (4) effects a splitting in the axial paths α, β, which proceed in different sections, namely, first in the direction of the optical axis (Z) and another section perpendicular thereto. The corrector piece (5) consists of three quadrupole fields (5a, 5b, 5c), which are symmetrical, i.e., the two outer quadrupole fields are equal in intensity and lie symmetrical to the center quadrupole field (5b). For production of a symmetrical ray path, a further quadrupole (7) is arranged at the output side. Reference numeral (8) indicates midway between the input and output sides of the corrector (3).

The construction, symmetrical with respect to the center plane ($Z_M$), of the corrector pieces (5, 6), which are only rotated relative to one another through 90° with respect to the optical axis (z), results in an equal path trajectory in the section plane rotated through 90°. One corrector plate (5) effects an influencing and elimination of chromatic aberration in that sectional plane in which the α path proceeds. The other corrector piece (6), which comprises three quadrupole fields (6a. 6(b), 6(c), acts on the a path proceeding in the other section, so that each of the corrector plates (5, 6) effects the influencing, or even eliminations, of the chromatic aberration in one of the two sections. All quadrupole and circular lens fields are of an electrostatic nature.

Not drawn is the fact that, by overlaying of octopole fields, principally in the region of the astigmatic intermediate images, a correction of the spherical aberration (3rd order axial focussing deviation) can be carried out. A considerable influencing of the efficiency of the particles of optical imaging systems can be achieved by elimination of the chromatic aberration and possibly also of the spherical aberration.

What is claimed is:

1. An electrostatic corrector for eliminating chromatic aberration of particle lenses having a straight optical axis and an electrostatic quadrupole for allocation to an objective lens, said electrostatic corrector comprising:

two corrector pieces positioned behind said electrostatic quadrupole and along said straight optical axis in a direction of radiation, said two corrector pieces having quadrupole fields rotatable 90° about said straight optical axis in relation to one another, with rotation able to occur so that a first astigmatic intermediate image of a first section lies in a first corrector piece of said two corrector pieces and a second astigmatic intermediate image perpendicular thereto, of a second section, lies in a second corrector piece of said two corrector pieces, with an additional electrostatic quadrupole being located on an output side, with each of said two corrector pieces consisting of three electrical quadrupole fields with said electrostatic quadrupoles being overlaid with a circular lens field.

2. The electrostatic corrector for eliminating chromatic aberration of particle lenses according to claim 1, wherein said two corrector pieces have symmetrical constructions.

3. The electrostatic corrector for eliminating chromatic aberration of particle lenses according to claim 1, wherein said two corrector pieces have center planes and symmetrical extensions of said quadrupole fields with respect to said center planes.

4. The electrostatic corrector for eliminating chromatic aberration of particle lenses according to claim 1, wherein said quadrupole fields of said two corrector pieces are overlaid by at least one quadrupole field.

5. The electrostatic corrector for eliminating chromatic aberration of particle lenses according to claim 4, further comprising octopole fields arranged in a region of said first astigmatic intermediate image and said second astigmatic intermediate region.

6. The electrostatic corrector for eliminating chromatic aberration of particle lenses according to claim 4, wherein a single multipole element generates both a quadrupole and an octopole field.

7. The electrostatic corrector for eliminating chromatic aberration of particle lenses according to claim 4, further comprising a third corrector piece connected downstream in a direction of said straight optical axis, said third corrector piece having a spatial arrangement and intensity of its circular lens fields and quadrupole fields so as to be a mirror symmetrical relative to a center point of said second corrector piece.

* * * * *